US012755939B2

(12) United States Patent
Hirayama

(10) Patent No.: US 12,755,939 B2
(45) Date of Patent: Oct. 6, 2026

(54) PLASMA PROCESSING APPARATUS

(71) Applicant: Tokyo Electron Limited, Tokyo (JP)

(72) Inventor: Masaki Hirayama, Fuchu City (JP)

(73) Assignee: Tokyo Electron Limited, Tokyo (JP)

( * ) Notice: Subject to any disclaimer, the term of this patent is extended or adjusted under 35 U.S.C. 154(b) by 446 days.

(21) Appl. No.: 18/406,281

(22) Filed: Jan. 8, 2024

(65) Prior Publication Data

US 2024/0242936 A1 Jul. 18, 2024

(30) Foreign Application Priority Data

Jan. 18, 2023 (JP) ................................ 2023-005798
Jul. 7, 2023 (JP) ................................ 2023-112408

(51) Int. Cl.
*H01J 37/32* (2006.01)

(52) U.S. Cl.
CPC .. *H01J 37/32247* (2013.01); *H01J 37/32082* (2013.01); *H01J 37/32229* (2013.01); *H01J 37/3244* (2013.01); *H01J 37/32541* (2013.01)

(58) Field of Classification Search
CPC ........... H01J 37/32082; H01J 37/33247; H01J 37/32229; H01J 37/3244
See application file for complete search history.

(56) References Cited

U.S. PATENT DOCUMENTS

| | | | |
|---|---|---|---|
| 11,854,772 | B2 | 12/2023 | Hirayama |
| 11,923,170 | B2 | 3/2024 | Kawakami et al. |
| 12,087,552 | B2 | 9/2024 | Hirayama |
| 2002/0108933 | A1 | 8/2002 | Hoffman et al. |
| 2003/0178143 | A1 | 9/2003 | Perrin |
| 2009/0140828 | A1 | 6/2009 | Shannon et al. |
| 2013/0292057 | A1 | 11/2013 | Ramaswamy et al. |
| 2014/0225503 | A1 | 8/2014 | Mori et al. |
| 2015/0075716 | A1 | 3/2015 | Ramaswamy et al. |
| 2016/0276134 | A1 | 9/2016 | Collins et al. |
| 2023/0010178 | A1 | 1/2023 | Hirayama |

(Continued)

FOREIGN PATENT DOCUMENTS

| | | |
|---|---|---|
| JP | H03-019332 A | 1/1991 |
| JP | H08-236448 A | 9/1996 |

(Continued)

*Primary Examiner* — Joseph A Miller, Jr.
(74) *Attorney, Agent, or Firm* — Armstrong Teasdale LLP

(57) ABSTRACT

A plasma processing apparatus, includes: a chamber providing a processing space; a substrate support inside the processing space; an upper electrode provided above the substrate support via the processing space; an emitter emitting electromagnetic waves into a plasma generating space and extending in a circumferential direction around a central axis of the chamber; and a waveguide supplying the electromagnetic waves to the emitter, wherein the waveguide includes a resonator, wherein the resonator includes a first short-circuit portion constituting one end of a waveguide path and second short-circuit portions constituting the other end or beams provided along a third short-circuit portion constituting the other end by a wall surface, wherein the second short-circuit portions or the beams are arranged axisymmetric around the central axis along the circumferential direction, and wherein the second short-circuit portions or the beams and gaps electromagnetically coupled to the emitter are arranged alternately along the circumferential direction.

19 Claims, 14 Drawing Sheets

(56) References Cited

U.S. PATENT DOCUMENTS

| | | | |
|---|---|---|---|
| 2024/0071730 | A1 | 2/2024 | Hirayama |
| 2024/0242934 | A1 | 7/2024 | Hirayama |
| 2024/0242936 | A1 | 7/2024 | Hirayama |
| 2024/0242937 | A1 | 7/2024 | Hirayama |

FOREIGN PATENT DOCUMENTS

| | | | |
|---|---|---|---|
| JP | 2007-217738 | A | 8/2007 |
| JP | 2011-103238 | A | 5/2011 |
| JP | 2020-092031 | A | 6/2020 |
| KR | 10-2021-0095196 | A | 7/2021 |

PLASMA PROCESSING APPARATUS

CROSS-REFERENCE TO RELATED APPLICATIONS

This application is based upon and claims the benefit of priority from Japanese Patent Application No. 2023-005798, filed on Jan. 18, 2023, and Japanese Patent Application No. 2023-112408, filed on Jul. 7, 2023, the entire contents of which are incorporated herein by reference.

TECHNICAL FIELD

The present disclosure relates to a plasma processing apparatus.

BACKGROUND

A plasma processing apparatus is used in processing a substrate. As a type of plasma processing apparatus, there is known a plasma processing apparatus that excites a gas using radio frequency waves such as VHF waves or UHF waves. Patent Document 1 below discloses such a plasma processing apparatus. The plasma processing apparatus of Patent Document 1 includes a processing container, a stage, an upper electrode, an introducer, and a waveguide. The stage is provided inside the processing container. The upper electrode is provided above the stage with a space within the processing container left therebetween. The introducer is a radio frequency wave introducer. The introducer is provided at a lateral end of the space and extends in a circumferential direction around a central axis of the processing container. The waveguide is configured to supply radio frequency waves to the introducer. The waveguide includes a resonator that provides a waveguide path. The waveguide path of the resonator extends in the circumferential direction around the central axis and extends in a direction in which the central axis extends. The waveguide path of the resonator is connected to the introducer.

PRIOR ART DOCUMENT

Patent Document

Patent Document 1: Japanese Laid-open Patent Publication No. 2020-92031

SUMMARY

According to one embodiment of the present disclosure, there is provided a plasma processing apparatus, including: a chamber configured to provide a processing space in the chamber; a substrate support provided inside the processing space; an upper electrode provided above the substrate support via the processing space; an emitter provided to emit electromagnetic waves into a plasma generating space and extending in a circumferential direction around a central axis of the chamber and the processing space; and a waveguide configured to supply the electromagnetic waves to the emitter, wherein the waveguide includes a resonator configured to provide a waveguide path, wherein the resonator includes a first short-circuit portion constituting one end of the waveguide path of the resonator and a plurality of second short-circuit portions constituting the other end of the waveguide path of the resonator or a plurality of beams provided along a third short-circuit portion constituted by a wall surface and constituting the other end of the waveguide path, wherein the plurality of second short-circuit portions or the plurality of beams are arranged axisymmetric around the central axis along the circumferential direction, and wherein the plurality of second short-circuit portions or the plurality of beams and a plurality of gaps electromagnetically coupled to the emitter are arranged alternately along the circumferential direction around the central axis.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
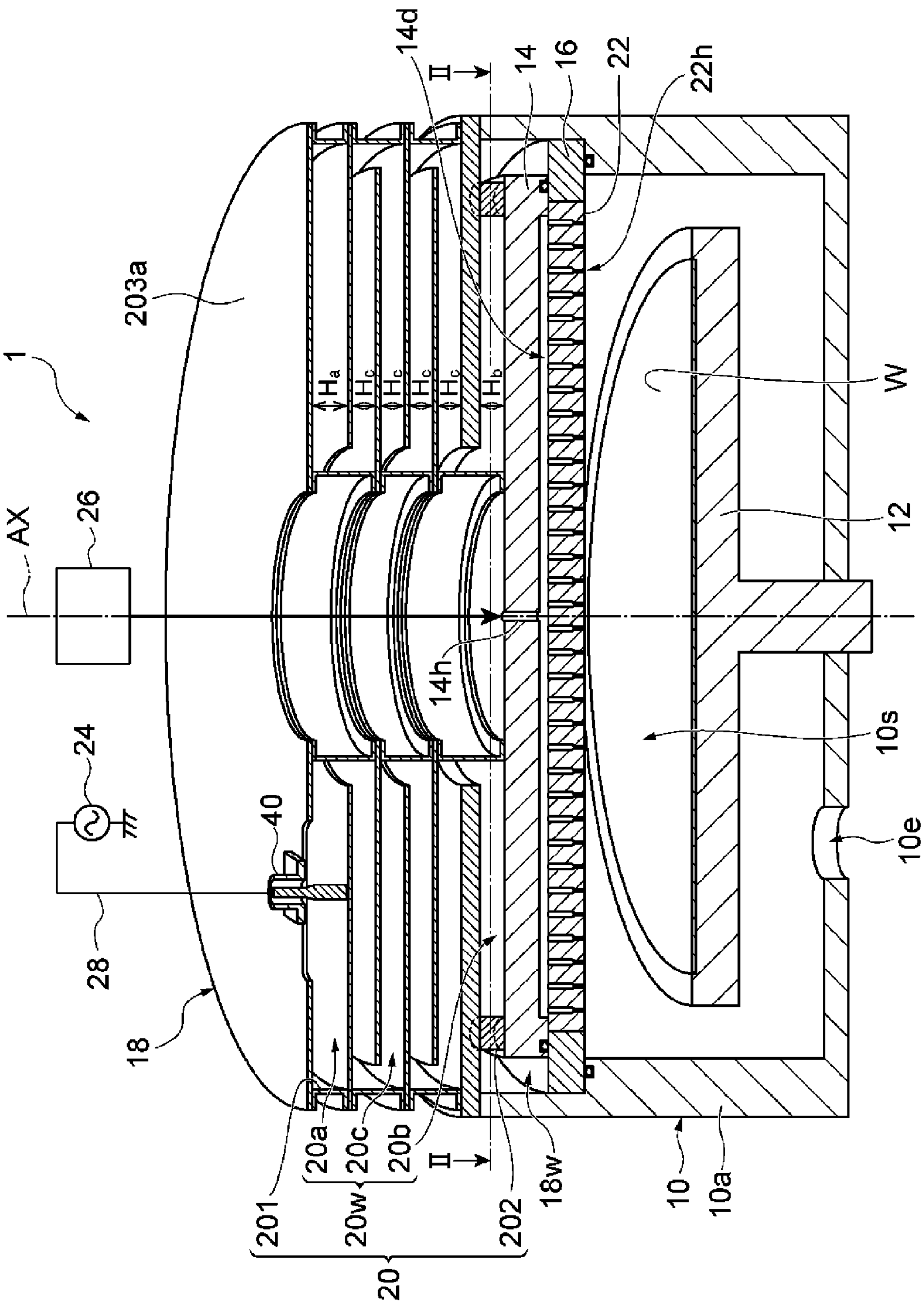
FIG. 1 is a diagram showing a plasma processing apparatus according to one exemplary embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Various exemplary embodiments will be described below in detail with reference to the drawings. In addition, the same or corresponding parts are designated by like reference numerals throughout the drawings.

FIG. 1 is a diagram showing a plasma processing apparatus according to one exemplary embodiment. The plasma processing apparatus 1 shown in FIG. 1 includes a chamber 10, a substrate support 12, an upper electrode 14, an emitter 16, and a waveguide 18.

The chamber 10 provides a processing space 10*s* in the chamber 10. The processing space 10*s* includes a plasma generating space. In the plasma processing apparatus 1, a substrate W is processed in the processing space 10*s*. The chamber 10 is made of metal such as aluminum or the like and is grounded. The chamber 10 includes a side wall 10*a* that is open at its upper end. The chamber 10 and the side wall 10*a* may have a generally cylindrical shape. The processing space 10*s* is provided inside the side wall 10*a*. A central axis of each of the chamber 10, the side wall 10*a*, and the processing space 10*s* is an axis AX. The chamber 10 may have a corrosion-resistant film on its surface. The corrosion-resistant film may be an yttrium oxide film, an yttrium oxide fluoride film, an yttrium fluoride film, a ceramic film including yttrium oxide or yttrium fluoride, or the like.

The bottom of the chamber 10 provides an exhaust port 10*e*. An exhaust device is connected to the exhaust port 10*e*. The exhaust device may include a vacuum pump, such as a dry pump and/or a turbomolecular pump, and an automatic pressure control valve.

The substrate support 12 is provided inside the processing space 10*s*. The substrate support 12 is configured to substantially horizontally support the substrate W mounted on its upper surface. The substrate support 12 has a substantially disk-like shape. A central axis of the substrate support 12 is the axis AX.

The upper electrode 14 is provided above the substrate support 12 via the processing space 10*s*. The upper electrode 14 is made of a conductor such as metal (for example, aluminum) and has a substantially disk-like shape. A central axis of the upper electrode 14 is the axis AX. The upper electrode 14 constitutes an excitation electrode together with a shower plate 22, which will be described later.

The emitter 16 is provided to emit electromagnetic waves into the plasma generating space. In the plasma processing apparatus 1, the plasma generating space is a space provided within the processing space 10*s* and provided directly below the excitation electrode, i.e., directly below the shower plate 22. In the plasma processing apparatus 1, the electromagnetic waves emitted from the emitter 16 into the plasma generating space excite a gas existing in the processing space 10*s* to form plasma. The electromagnetic waves emitted from the emitter 16 into the plasma generating space may be radio frequency waves such as VHF waves or UHF waves. The emitter 16 is made of a dielectric material such as quartz, aluminum nitride, or aluminum oxide. The emitter 16 is provided at a lateral end of the processing space 10*s* to extend in a circumferential direction around the axis AX. The emitter 16 may have an annular shape.

The waveguide 18 is configured to supply electromagnetic waves to the emitter 16. The electromagnetic waves are generated by a radio frequency power source 24, which will be described later. The electromagnetic waves propagate to the emitter 16 via the waveguide 18. The electromagnetic waves are introduced from the emitter 16 into the processing space 10*s*. The waveguide 18 includes a resonator 20. Details of the resonator 20 will be described later.

In one embodiment, the plasma processing apparatus 1 may further include the shower plate 22. The shower plate 22 may be made of metal such as aluminum. The emitter 16 extends to surround the shower plate 22. The emitter 16 and the shower plate 22 are disposed to close an opening at the upper end of the chamber 10. The shower plate 22 provides a plurality of gas holes 22*h*. The gas holes 22*h* extend in a thickness direction (vertical direction) of the shower plate 22 and penetrate the shower plate 22.

The shower plate 22 is provided below the upper electrode 14. The shower plate 22 extends above the plasma generating space. The shower plate 22 and the upper electrode 14 define a gas diffusion space 14*d* therebetween. A central axis of the gas diffusion space 14*d* may be the axis AX. The gas holes 22*h* of the shower plate 22 are connected to the gas diffusion space 14*d*. The upper electrode 14 also provides an inlet 14*h*. The inlet 14*h* may extend along the axis AX. The inlet 14*h* is connected to the gas diffusion space 14*d*. A gas supply 26 is connected to the gas diffusion space 14*d*. The gas outputted from the gas supply 26 is supplied to the processing space 10*s* via the inlet 14*h*, the gas diffusion space 14*d*, and the gas holes 22*h*.

The plasma processing apparatus 1 may further include a radio frequency power source 24. The radio frequency power source 24 is electrically coupled to a waveguide path of the resonator 20 and is configured to generate a radio frequency power whose frequency is variable. The electromagnetic waves to be introduced into the plasma generating space are generated based on the radio frequency power generated by the radio frequency power source 24. The radio frequency power source 24 may be directly connected to the waveguide path of the resonator 20 using a coaxial line 28. That is, the radio frequency power source 24 may be coupled to the waveguide path of the resonator 20 without using a matching device for impedance matching.

Figure 2:
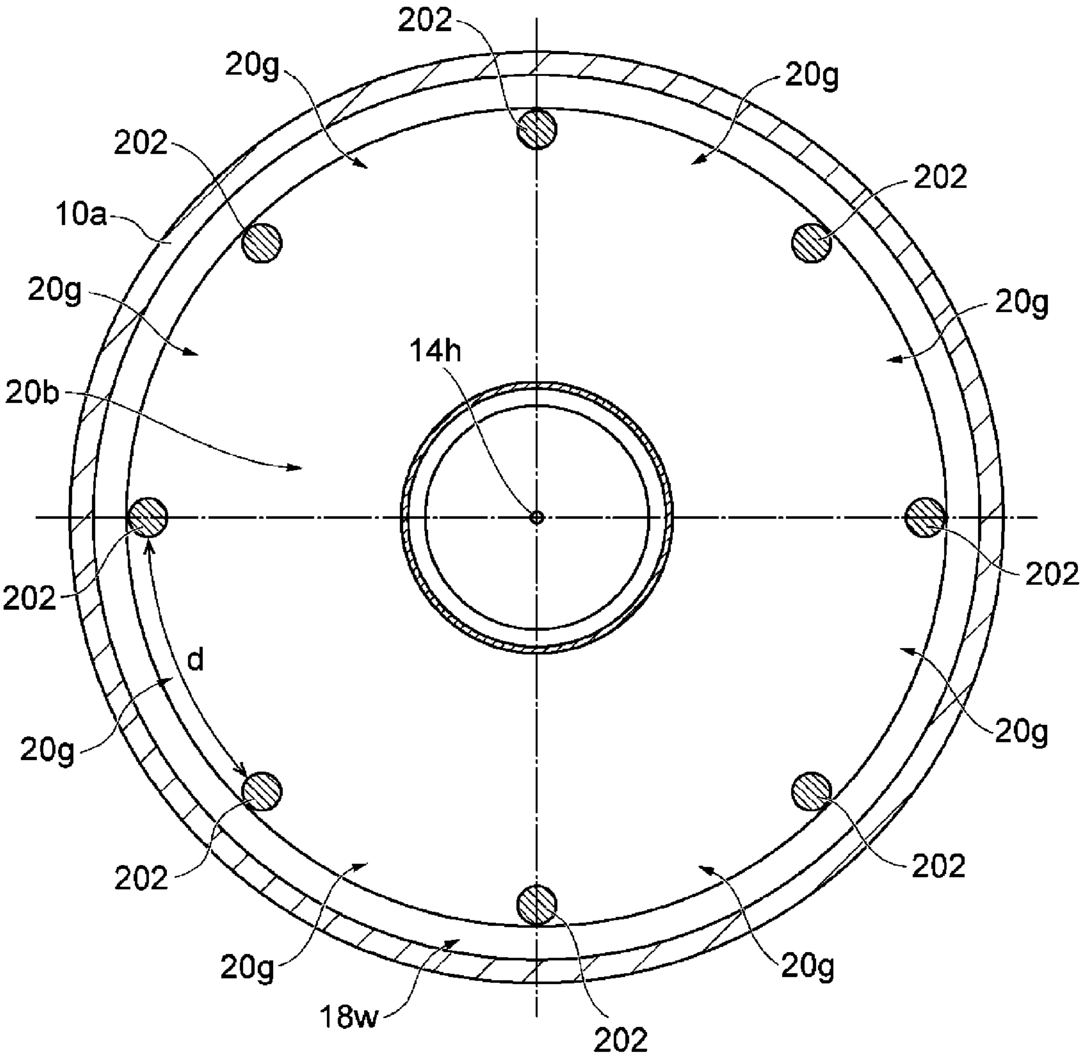
FIG. 2 is a diagram showing a lower portion of a resonator of the plasma processing apparatus according to one exemplary embodiment.

Hereinafter, FIG. 2 will be referred together with FIG. 1. FIG. 2 is a diagram showing a lower portion of the resonator of the plasma processing apparatus according to one exemplary embodiment. FIG. 2 is a cross-sectional view taken along line II-II in FIG. 1. The resonator 20 provides the waveguide path 20*w*. The waveguide path 20*w* may provide a cavity surrounded by a wall made of a conductor such as metal (hereinafter referred to as a "conductor wall"). The conductor wall of the waveguide path 20*w* may be made of aluminum alloy, copper, nickel, stainless steel, or the like, and may be coated with a low-resistance material such as silver, gold, or rhodium.

The resonator 20 includes a first short-circuit portion 201 and a plurality of second short-circuit portions 202. The first short-circuit portion 201 constitutes one end (first end) of the waveguide path 20*w* of the resonator 20. In one embodiment, the first short-circuit portion 201 may extend in the circumferential direction around the axis AX.

The plurality of second short-circuit portions 202 constitute the other end (second end) of the waveguide path 20*w* of the resonator 20. The plurality of second short-circuit portions 202 are arranged axisymmetric around the axis AX along the circumferential direction. The plurality of second short-circuit portions 202 may be arranged at equal intervals in the circumferential direction. In the example shown in FIGS. 1 and 2, each of the plurality of second short-circuit portions 202 is made of metal, and is a columnar member extending between a pair of conductor walls (an upper conductor wall and a lower conductor wall) constituting the lower portion, which will be described later.

The resonator 20 provides a plurality of gaps 20*g*. The plurality of gaps 20*g* are arranged alternately with the plurality of second short-circuit portions 202 along the circumferential direction around the axis AX. That is, the second end of the resonator 20 includes the plurality of second short-circuit portions 202 and the plurality of gaps 20*g*. The plurality of gaps 20*g* are electromagnetically coupled to the emitter 16. In the example shown in FIGS. 1 and 2, the plurality of gaps 20*g* are connected to the emitter 16 via a waveguide path 18*w* of the waveguide 18. The waveguide path 18*w* may be provided between the upper electrode 14 and the side wall 10*a* of the chamber 10, and may extend around the axis AX.

A distance d in the circumferential direction between two arbitrary second short-circuit portions adjacent in the circumferential direction among the plurality of second short-circuit portions 202 may satisfy a following formula (1):

$$0.05\lambda g < d < 0.3\lambda g, \quad (1)$$

where λg is a wavelength of the electromagnetic waves in the waveguide path 20*w*. When formula (1) is satisfied, the resonator 20 may supply a part of the electromagnetic waves propagating through the waveguide path 20*w* to the emitter 16, and may have a moderately large reflection coefficient of electromagnetic waves at the other end in the resonator 20.

A resonator length L of the resonator 20 between the first short-circuit portion 201 and the plurality of second short-circuit portions 202 (distance by which the first short-circuit portion 201 and the plurality of second short-circuit portions 202 are connected along the waveguide path 20*w*) may satisfy a following formula (2):

$$(n-0.2)\lambda g/2 < L < n\lambda g/2, \quad (2)$$

where λg is the wavelength of the electromagnetic waves in the waveguide path 20*w*, and *n* is an integer of 1 or more. A reactance in the plurality of gaps 20*g* is inductive. Therefore, the resonator length L may be set to a value slightly smaller than nλg/2 so as to satisfy formula (2).

In one embodiment, the waveguide path 20*w* of the resonator 20 may have a layered structure including an upper portion 20*a* and a lower portion 20*b*. The lower portion 20*b* extends in a radial direction (radially outward direction) with respect to the axis AX toward the plurality of second short-circuit portions 202 around the axis AX. The upper portion 20*a* extends from the first short-circuit portion 201 in an opposite direction to the radial direction (radially inward direction) above the lower portion 20*b* and around the axis AX. That is, the upper portion 20*a* extends from the first short-circuit portion 201 toward the axis AX. The waveguide path 20*w* extends alternately in the radial direction and the opposite direction (radially outward and inward directions) in a meandering manner from the first short-circuit portion 201 to the plurality of second short-circuit portions 202, around the axis AX.

In one embodiment, the waveguide path 20*w* may further include an intermediate portion 20*c*. The intermediate portion 20*c* is provided between the upper portion 20*a* and the lower portion 20*b*. That is, the intermediate portion 20*c* is provided below the upper portion 20*a* and above the lower portion 20*b*. One end of the intermediate portion 20*c* is connected to an inner end of the upper portion 20*a*, i.e., an end of the upper portion 20*a* on an inner side with respect to the first short-circuit portion 201. The other end of the intermediate portion 20*c* is connected to an inner end of the lower portion 20*b*, i.e., an end of the lower portion 20*b* on an inner side with respect to the plurality of second short-circuit portions 202. The intermediate portion 20*c* may extend alternately in the radial direction and in the opposite direction (radially outward and inward directions) in a meandering manner around the axis AX.

In one embodiment, the plasma processing apparatus 1 may further include a connector 40 for introducing the electromagnetic waves into the waveguide path 20*w*. The connector 40 is a portion of the coaxial line 28. The radio frequency power source 24 is coupled to the upper portion 20*a* via the coaxial line 28 and the connector 40. The connector 40 may be coupled to the upper portion 20*a* at a position distanced apart from the axis AX in the radial direction. Details of the connector 40 will be described later.

A length $H_a$ of the upper portion 20*a* (or a height of the upper portion 20*a*) in an extension direction of the axis AX, i.e., in a vertical direction, may be longer than lengths of the other portions of the waveguide path 20*w* in the vertical direction. In the example shown in FIG. 1, the length $H_a$ is longer than a length $H_b$ of the lower portion 20*b* (or a height of the lower portion 20*b*) in the vertical direction and a length $H_c$ of the intermediate portion 20*c* (or a height of the intermediate portion 20*c*) in the vertical direction. The length $H_a$ is a distance in the vertical direction between a pair of conductor walls (an upper conductor wall and a lower conductor wall) of the upper portion 20*a*. The length $H_b$ is a distance in the vertical direction between a pair of conductor walls (an upper conductor wall and a lower conductor wall) of the lower portion 20*b*. Further, the length $H_c$ is a distance in the vertical direction between a pair of conductor walls (an upper conductor wall and a lower conductor wall) of the intermediate portion 20*c*. A reactance of the upper portion 20*a* is changed depending on the length $H_a$ of the upper portion 20*a*. Therefore, it is possible to adjust the resonator length L according to the length $H_a$ of the upper portion 20*a*.

Figure 3:
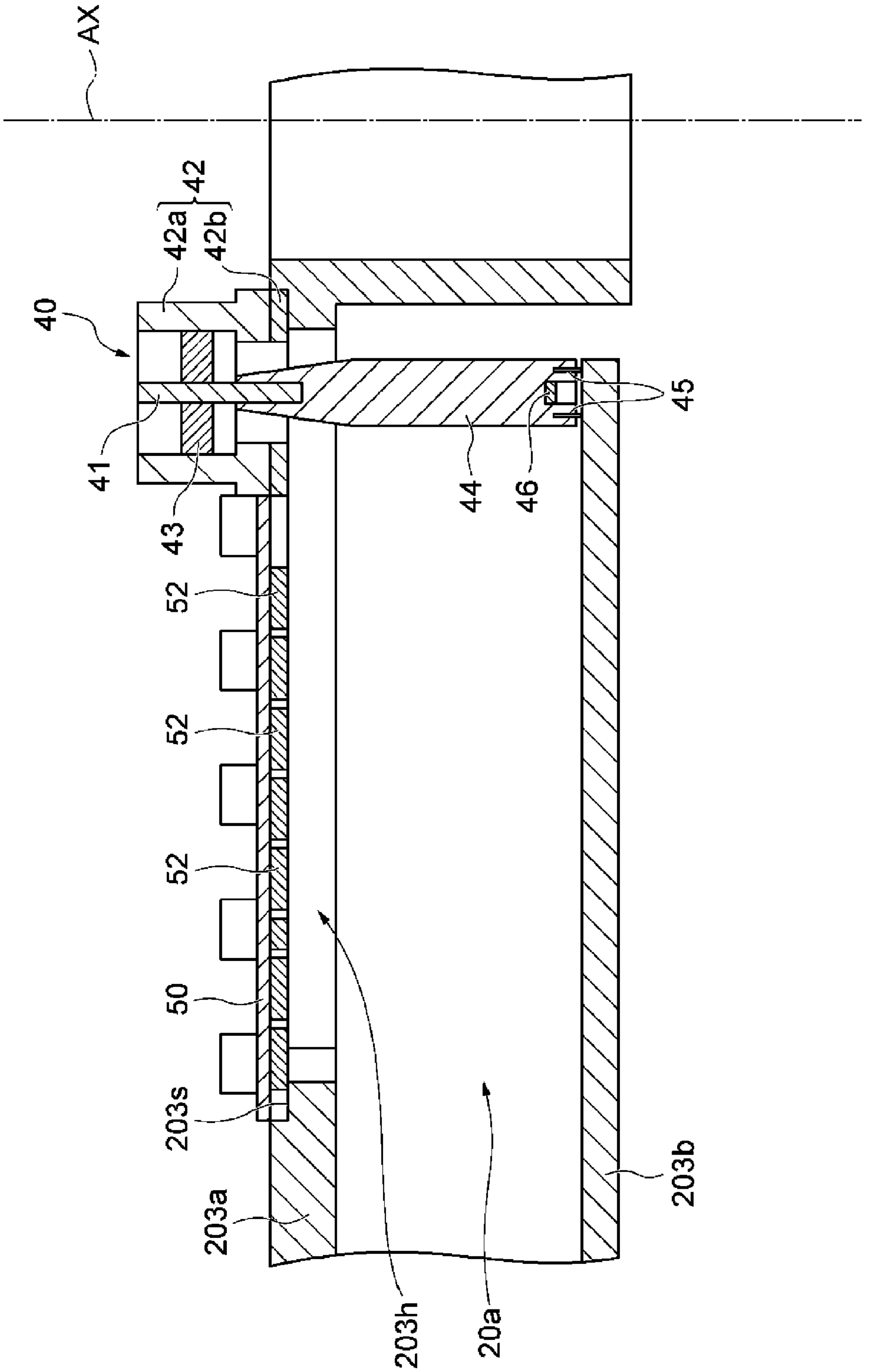
FIG. 3 is an enlarged partial cross-sectional view of the resonator and a connector of the plasma processing apparatus according to one exemplary embodiment.
Figure 4:
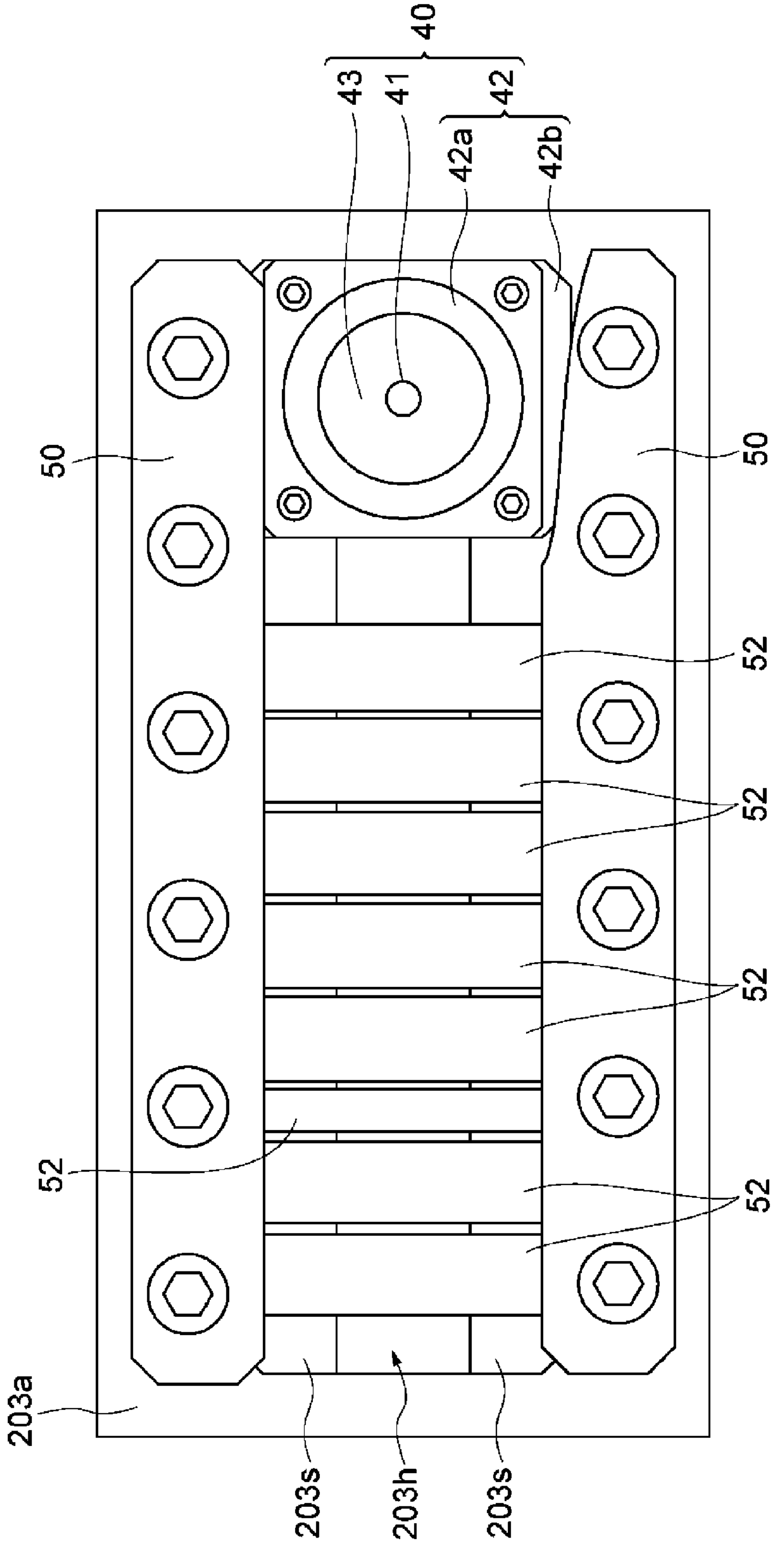
FIG. 4 is an enlarged partial plan view showing the resonator and the connector of the plasma processing apparatus according to one exemplary embodiment.

Hereinafter, an example of the structure of the connector 40 will be described with reference to FIGS. 3 and 4 as well as FIG. 1. FIG. 3 is an enlarged partial cross-sectional view showing the resonator and the connector of the plasma processing apparatus according to one exemplary embodiment. FIG. 4 is an enlarged partial plan view showing the resonator and the connector of the plasma processing apparatus according to one exemplary embodiment. FIG. 4 shows a state in which one of a pair of pressing members is partially broken.

The connector 40 is coupled to the waveguide path 20*w* at the upper portion 20*a*, as described above. The connector 40 may be configured to be movable in the radial direction with respect to the axis AX. In this case, the position where the connector 40 is coupled to the resonator 20 may be adjusted to a position where a reflection of the electromagnetic waves may be suppressed (for example, a position where there is no reflection).

In one embodiment, the connector 40 may be a coaxial connector. In this case, the connector 40 may include a center conductor 41, an outer conductor 42, a spacer 43, a coupling rod 44, and one or more contact members 45.

The center conductor 41 has a rod shape. The center conductor 41 is electrically connected to the radio frequency power source 24. The outer conductor 42 has a cylindrical shape. The center conductor 41 is provided coaxially with the outer conductor 42. The spacer 43 is made of an insulating material such as polytetrafluoroethylene or the like. The spacer 43 is interposed between the center conductor 41 and the outer conductor 42.

A through-hole 203*h* connected to a cavity of the upper portion 20*a* is formed in the upper conductor wall 203*a* of the upper portion 20*a*. The through-hole 203*h* extends long in the radial direction with respect to the axis AX. The upper conductor wall 203*a* provides support surfaces 203*s* on both sides of the through-hole 203*h*. The support surfaces 203*s* face upward.

The coupling rod 44 is coupled to a lower end of the center conductor 41. The coupling rod 44 extends downward through the through-hole 203*h*. The one or more contact members 45 are provided at a lower end of the coupling rod 44. The one or more contact members 45 may elastically contact the lower conductor wall 203*b* of the upper portion 20*a*. In one embodiment, the connector 40 may include a magnet 46 which is arranged within the coupling rod 44 to prevent the one or more contact members 45 from falling off from the coupling rod 44.

In one embodiment, the connector 40 may include a plurality of contact probes as the one or more contact members 45. Each of the plurality of contact probes includes a barrel, a spring disposed within an inner hole of the barrel, and a plunger extending downward from the inner hole of the barrel and pressed downward by the spring. The plurality of contact probes may be arranged in a circumferential direction around a central axis of the coupling rod 44. Alternatively, the connector 40 may include a spiral spring gasket or an obliquely-wound coil spring as the one or more contact members 45.

The outer conductor 42 is in contact with the support surfaces 203*s*. The outer conductor 42 is movable in the radial direction on the support surfaces 203*s*. Therefore, the coupling position of the connector 40 to the upper portion 20*a* in the radial direction may be adjusted to suppress reflection of the radio frequency power.

In a state in which the position of the connector 40 in the radial direction is set, the outer conductor 42 may be held between the support surfaces 203*s* and each of the pair of pressing members 50. Each of the pair of pressing members 50 has a plate shape, for example. The pair of pressing members 50 are fixed to the upper conductor wall 203*a* using a plurality of bolts. Further, one or more covers 52 may be disposed to cover the through-hole 203*h* in order to prevent leakage of the electromagnetic waves from the through-hole 203*h*, and may be held between the support surfaces 203*s* and each of the pair of pressing members 50.

In one embodiment, the outer conductor 42 may include a first member 42*a* and a second member 42*b*. The first member 42*a* is provided on the second member 42*b* and is fixed to the second member 42*b*. The first member 42*a* has a cylindrical shape. The spacer 43 is provided between the first member 42*a* and the center conductor 41. The second member 42*b* has a plate shape and provides a through-hole that is continuous with an inner hole of the first member 42*a*. The second member 42*b* is held between the support surfaces 203*s* and each of the pair of pressing members 50.

In the plasma processing apparatus 1 described above, resonance of the electromagnetic waves is facilitated between the first short-circuit portion 201 and the plurality of second short-circuit portions 202. Moreover, according to the first short-circuit portion 201 and the plurality of second short-circuit portions 202, uniform resonance of the electromagnetic waves in the circumferential direction is facilitated. Resonant electromagnetic waves are emitted from the emitter 16 into the processing space 10*s* through the plurality of gaps 20*g* existing between the plurality of second short-circuit portions 202. Therefore, according to the plasma processing apparatus 1, plasma is efficiently generated by the electromagnetic waves resonated between the first short-circuit portion 201 and the plurality of second short-circuit portions 202.

Figure 5:
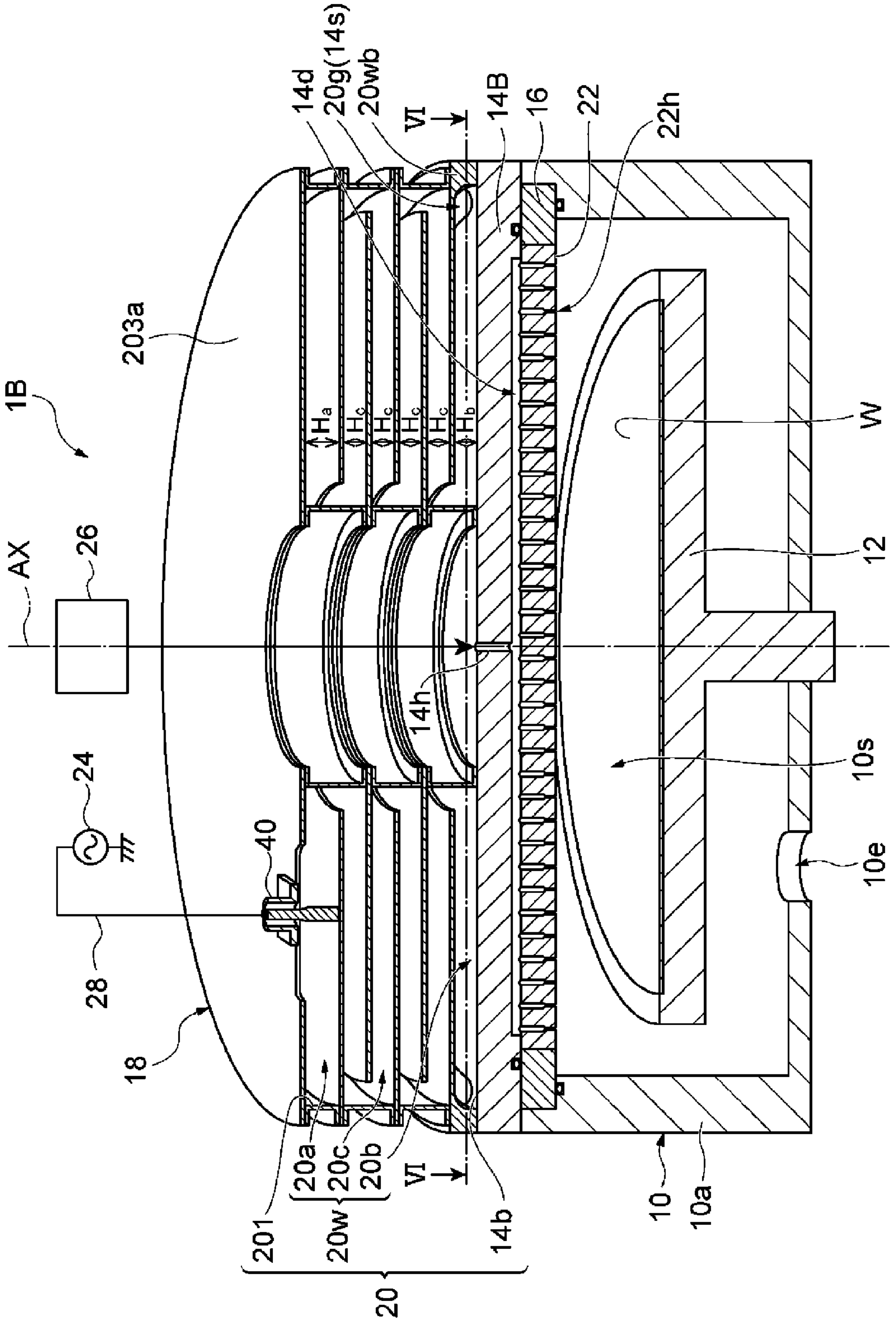
FIG. 5 is a diagram showing a plasma processing apparatus according to another exemplary embodiment.
Figure 6:
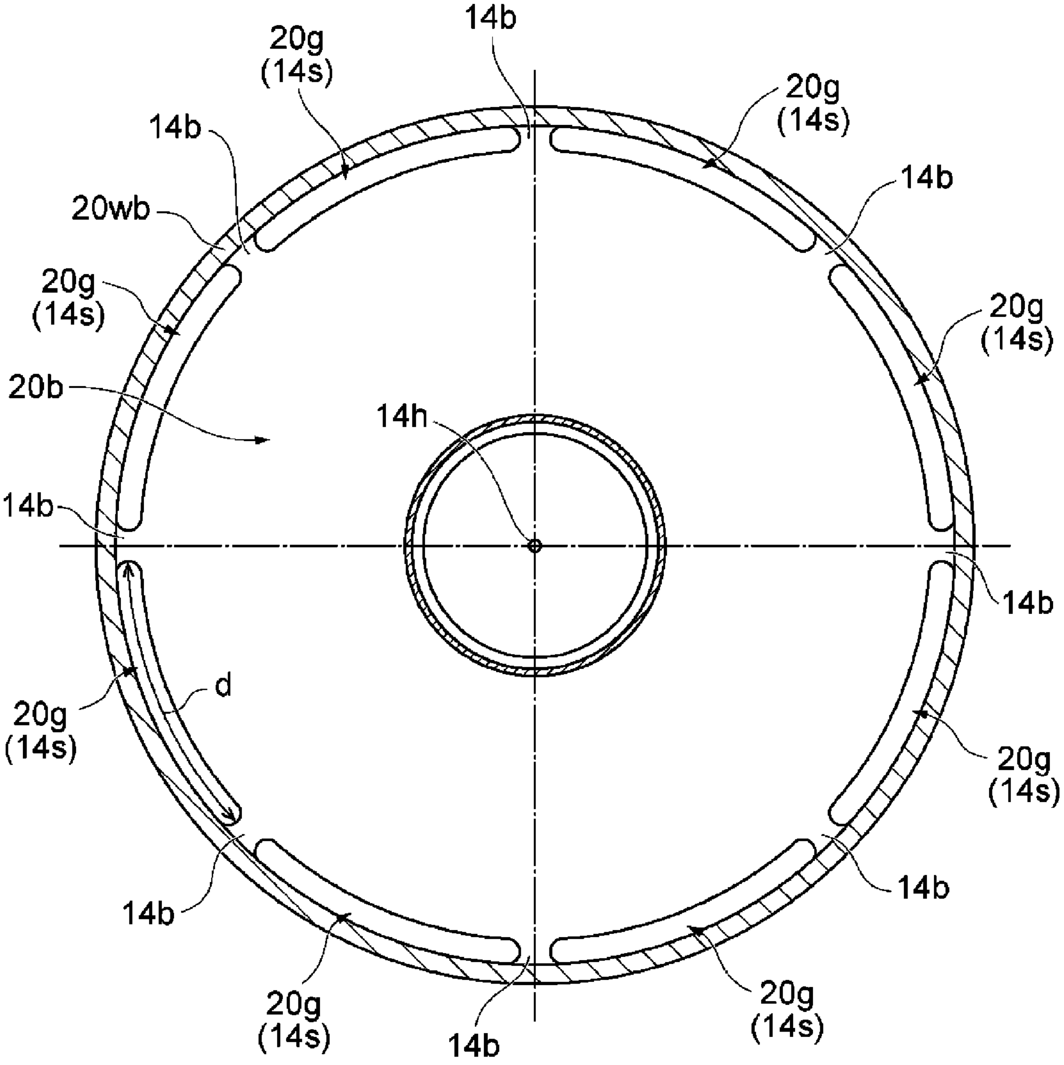
FIG. 6 is a diagram showing a lower portion of a resonator of the plasma processing apparatus according to another exemplary embodiment.

Hereinafter, a plasma processing apparatus according to another exemplary embodiment will be described with reference to FIGS. 5 and 6. FIG. 5 is a diagram showing a plasma processing apparatus according to another exemplary embodiment. FIG. 6 is a diagram showing a lower portion of a resonator of the plasma processing apparatus according to another exemplary embodiment. FIG. 6 is a cross-sectional view taken along line VI-VI in FIG. 5. The plasma processing apparatus 1B shown in FIGS. 5 and 6 will be described below in terms of differences from the plasma processing apparatus 1.

The plasma processing apparatus 1B includes an upper electrode 14B instead of the upper electrode 14. The upper electrode 14B provides a plurality of slots 14*s* and includes a plurality of beams 14*b*. The plurality of slots 14*s* are disposed above the emitter 16. The plurality of slots 14*s* penetrate the upper electrode 14B along its thickness direction (vertical direction) and extend in the circumferential direction. The plurality of slots 14*s* are spaced apart from each other and arranged along the circumferential direction around the axis AX. The plurality of slots 14*s* may be arranged at equal intervals. The plurality of beams 14*b* are arranged alternately with the plurality of slots 14*s* along the circumferential direction around the axis AX. The plurality of beams 14*b* interconnect inner and outer portions of the upper electrode 14B.

In the resonator 20 of the plasma processing apparatus 1B, the plurality of slots 14*s* constitute the plurality of gaps 20*g*. Further, the plurality of slots 14*s* and the plurality of beams 14*b* are provided near or along a third short-circuit portion formed of a wall surface 20*wb* and constituting the other end of the waveguide path 20*w*.

In the plasma processing apparatus 1B, electromagnetic wave resonance occurs between the first short-circuit portion 201 and the wall surface 20*wb*. The electromagnetic waves resonated in the resonator 20 are supplied to the emitter 16 through the plurality of gaps 20*g*, i.e., the plurality of slots 14*s*. The electromagnetic waves supplied to the emitter 16 are emitted from the emitter 16 into the processing space 10*s*.

Figure 7:
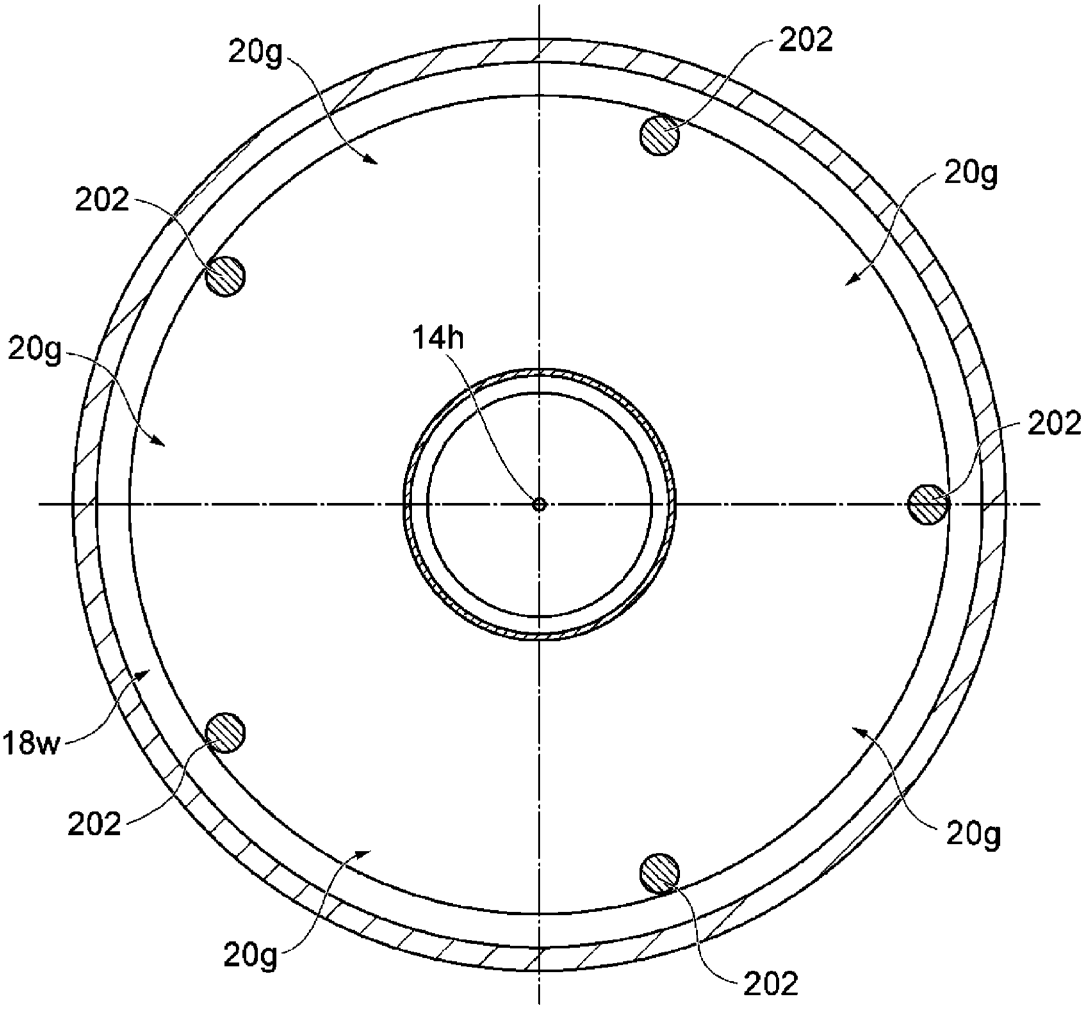
FIG. 7 is a diagram showing a lower portion of a resonator of a plasma processing apparatus according to another exemplary embodiment.

Hereinafter, reference is made to FIG. 7. FIG. 7 is a diagram showing a lower portion of a resonator of a plasma processing apparatus according to another exemplary embodiment. The embodiment shown in FIG. 7 is a modification of the plasma processing apparatus shown in FIGS. 1 to 4. In the example shown in FIG. 2, the number of the plurality of gaps 20*g* is eight, which is an even number. Further, the number of the plurality of second short-circuit portions 202 is also eight, which is an even number. Herein, the number of the plurality of gaps 20*g* and the number of the plurality of second short-circuit portions 202 may be an even number other than eight. In the embodiment shown in FIG. 7, the number of the plurality of gaps 20*g* is five, which is an odd number. Further, the number of the plurality of second short-circuit portions 202 is also five, which is an odd number. Herein, the number of the plurality of gaps 20*g* and the number of the plurality of second short circuit portions 202 may be an odd number other than five. When the number of the plurality of gaps 20*g* is an odd number, generation of an electric field intensity distribution (or plasma density distribution), which is two-fold rotationally symmetric around the axis AX, in the plasma generating space is suppressed as compared with a case where the number of the plurality of gaps 20*g* is an even number. Other configurations of the plasma processing apparatus shown in FIG. 7 are the same as the corresponding configurations of the plasma processing apparatus 1 shown in FIGS. 1 to 4.

Figure 8:
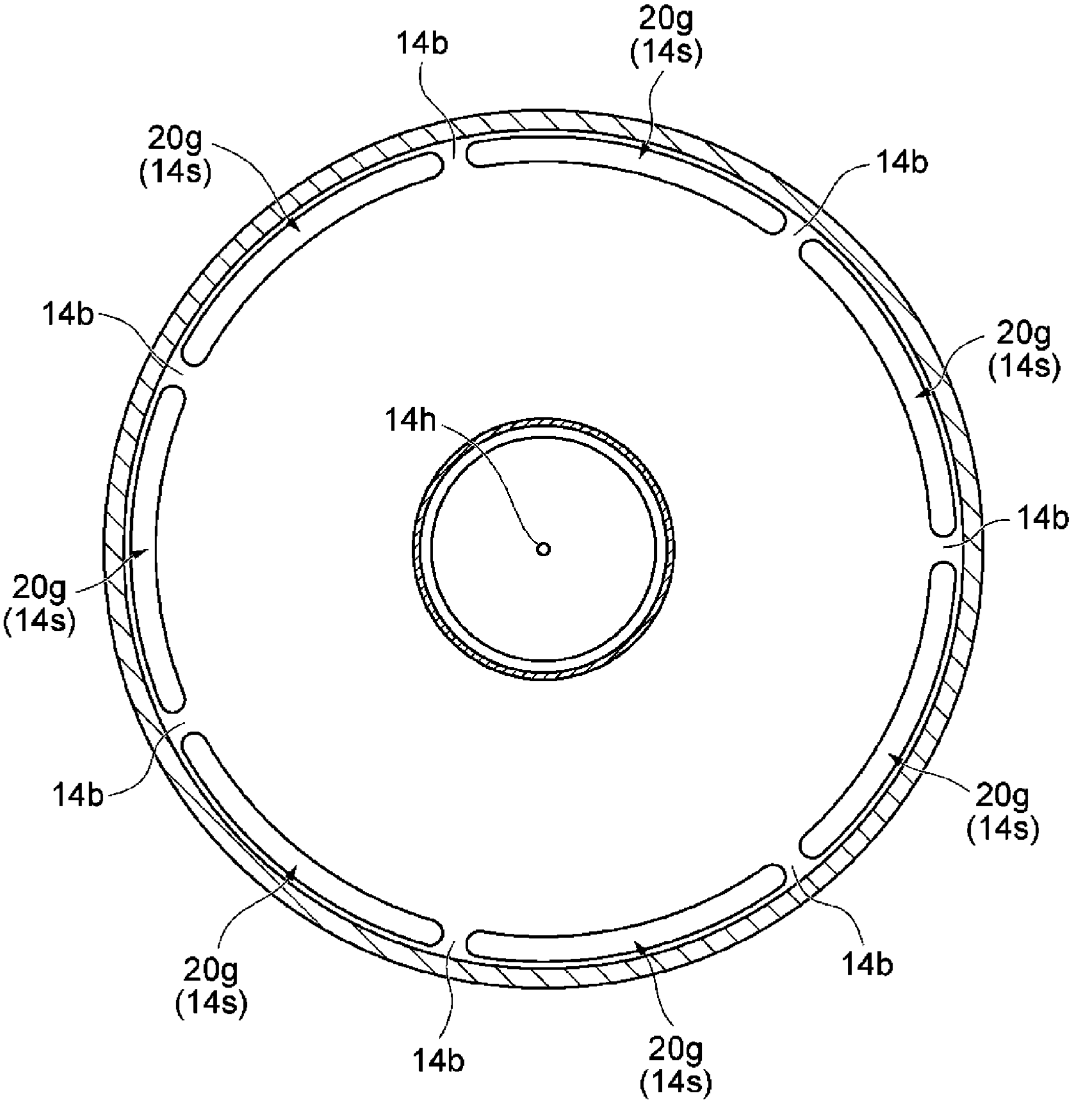
FIG. 8 is a diagram showing a lower portion of a resonator of a plasma processing apparatus according to another exemplary embodiment.

Hereinafter, reference is made to FIG. 8. FIG. 8 is a diagram showing a lower portion of a resonator of a plasma processing apparatus according to another exemplary embodiment. The embodiment shown in FIG. 8 is a modification of the plasma processing apparatus shown in FIGS. 5 and 6. In the example shown in FIG. 6, the number of the plurality of gaps 20*g* (i.e., the plurality of slots 14*s*) is eight, which is an even number. Further, the number of the plurality of beams 14*b* is also eight, which is an even number. Herein, the number of the plurality of gaps 20*g* and the number of the plurality of beams 14*b* may be an even number other than eight. In the embodiment shown in FIG. 8, the number of the plurality of gaps 20*g* (i.e., the plurality of slots 14*s*) is seven, which is an odd number. Further, the number of the plurality of beams 14*b* is also seven, which is an odd number. Herein, the number of the plurality of gaps 20*g* and the number of the plurality of beams 14*b* may be an odd number other than seven. When the number of the plurality of gaps 20*g* is an odd number, generation of an electric field intensity distribution (or plasma density distribution), which is two-fold rotationally symmetric around the axis AX, in the plasma generating space is suppressed as compared with a case where the number of the plurality of gaps 20*g* is an even number. Other configurations of the plasma processing apparatus shown in FIG. 8 are the same as the corresponding configurations of the plasma processing apparatus 1B shown in FIGS. 5 to 6.

Figure 9:
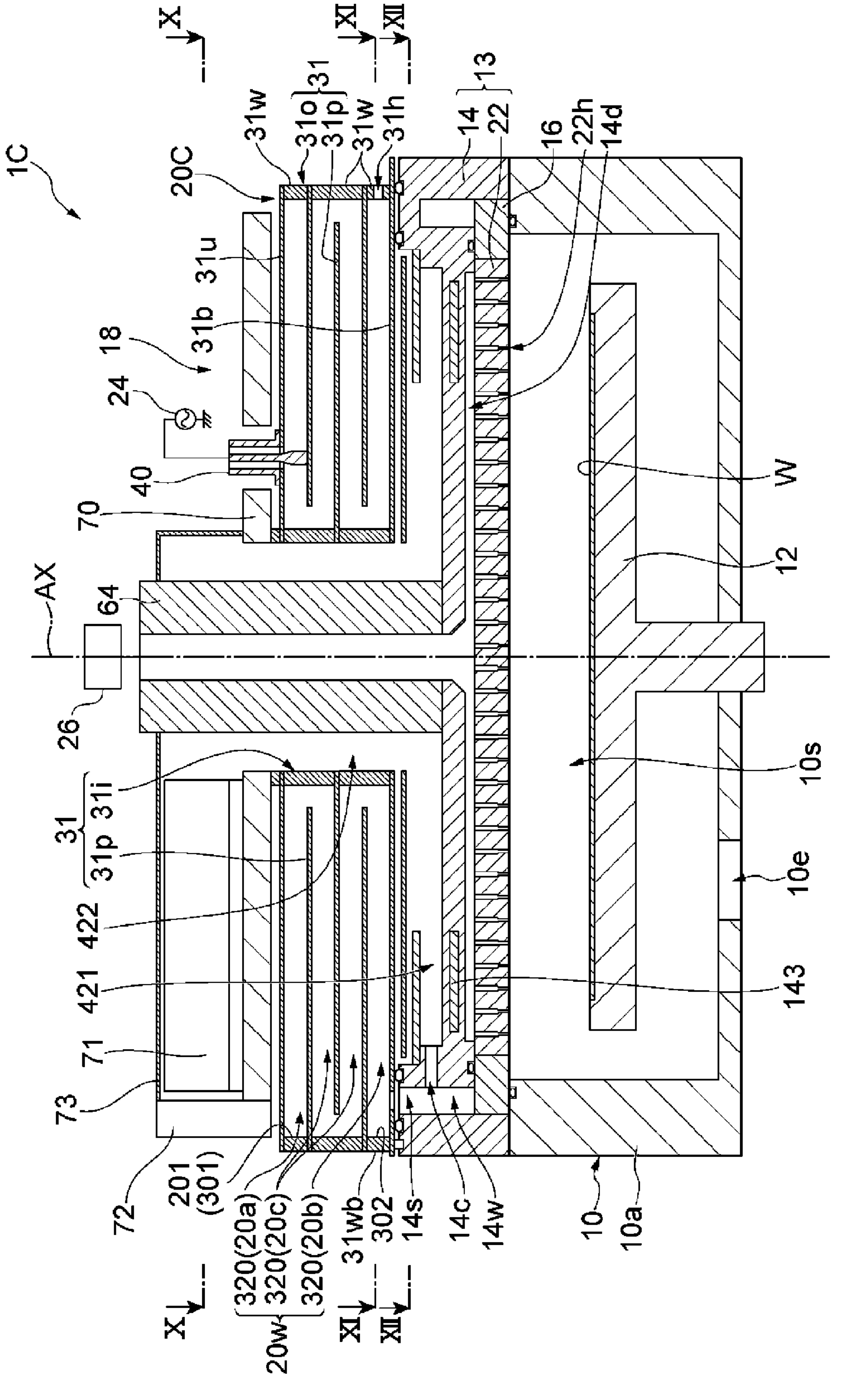
FIG. 9 is a diagram showing a plasma processing apparatus according to another exemplary embodiment.
Figure 10:
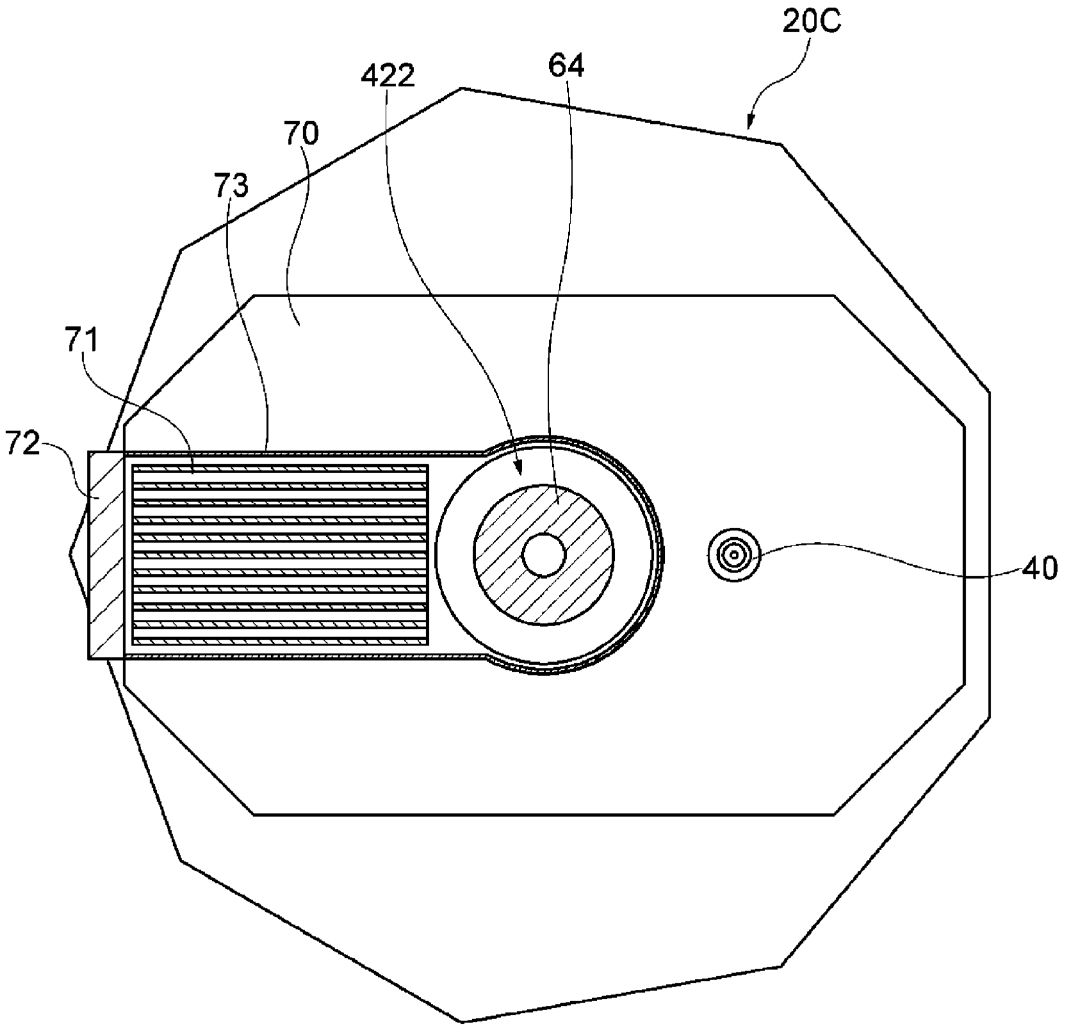
FIG. 10 is a cross-sectional view taken along line X-X in FIG. 9.
Figure 11:
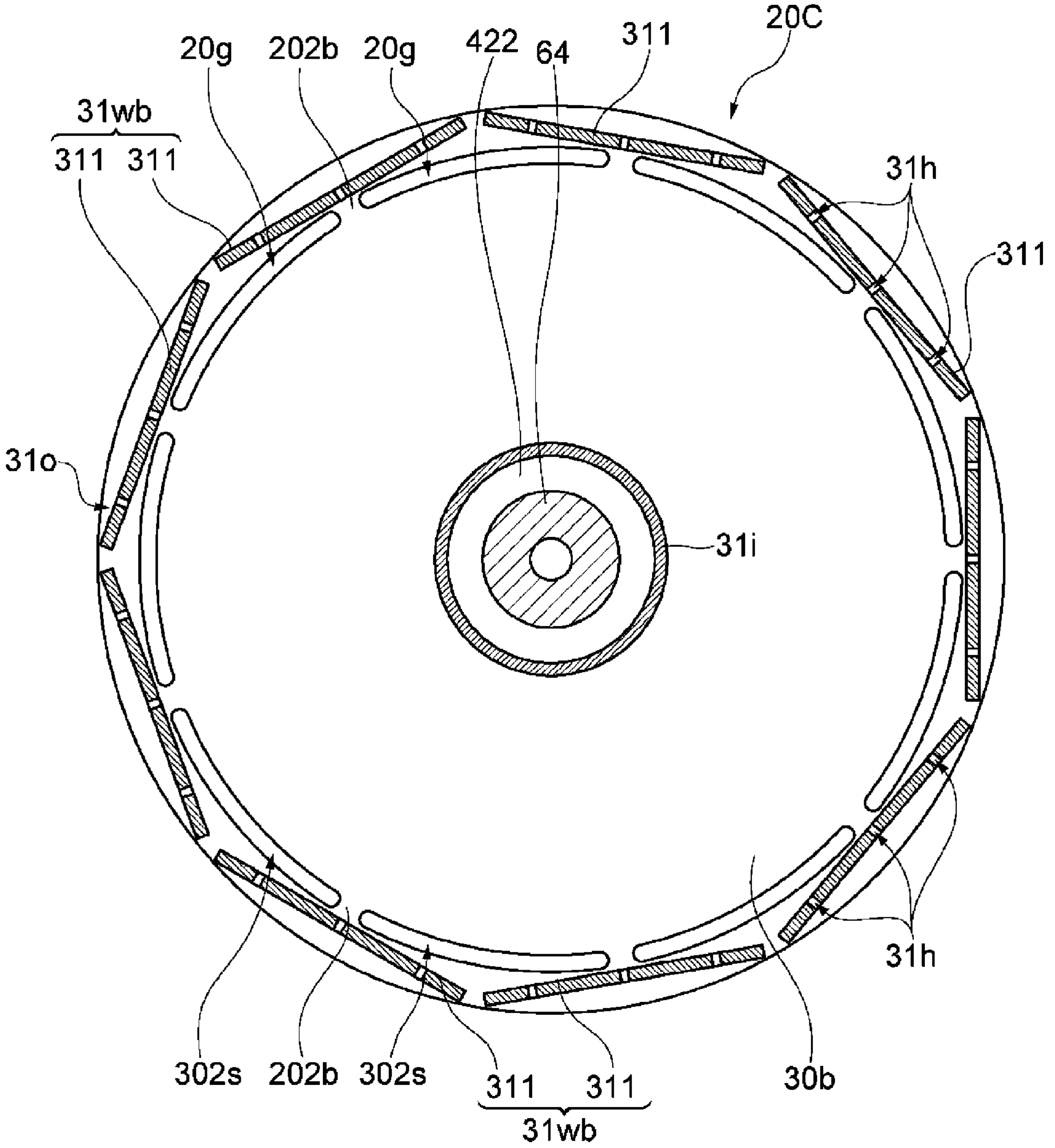
FIG. 11 is a cross-sectional view taken along line XI-XI in FIG. 9.
Figure 12:
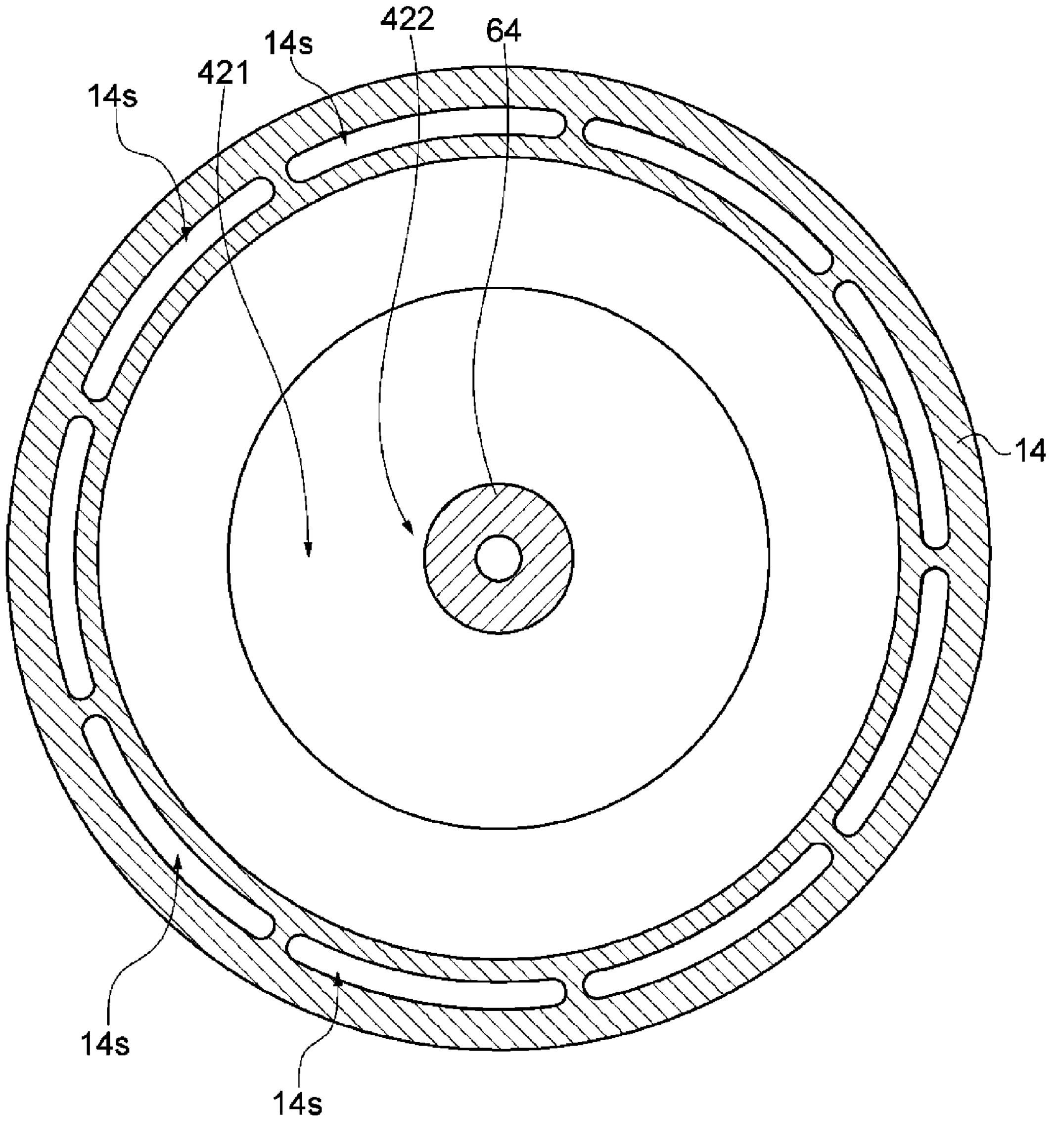
FIG. 12 is a cross-sectional view taken along line XII-XII in FIG. 9.

Hereinafter, a plasma processing apparatus according to another exemplary embodiment will be described with reference to FIGS. 9 to 12. FIG. 9 is a diagram showing a plasma processing apparatus according to another exemplary embodiment. FIG. 10 is a cross-sectional view taken along line X-X in FIG. 9. FIG. 11 is a cross-sectional view taken along line XI-XI in FIG. 9. FIG. 12 is a cross-sectional view taken along line XII-XII in FIG. 9. The plasma processing apparatus 1C shown in FIGS. 9 to 12 will be described below in terms of differences from the plasma processing apparatus 1B.

The plasma processing apparatus 1C further includes a gas pipe 64. The gas pipe 64 extends vertically inside an inner portion 31*i* of a resonator 20C, which will be described later. A central axis of the gas pipe 64 is located on the axis AX. The gas pipe 64 is connected between the gas diffusion space 14*d* and the gas supply 26.

The plasma processing apparatus 1C includes a resonator 20C instead of the resonator 20. The resonator 20C is provided on an excitation electrode 13. The excitation electrode 13 includes the upper electrode 14 and the shower plate 22. Just like the resonator 20, the resonator 20C includes a conductor portion 31 that defines a waveguide path 20*w*. The conductor portion 31 is made of a conductive material such as metal. The conductive material forming the conductor portion 31 may include aluminum, stainless steel, copper, brass, or the like.

The resonator 20C includes a first end 301 and a wall 31*wb* which is a second end 302. The first end 301 is the same as the first short-circuit portion 201 described above, constitutes one end of the waveguide path 20*w*, and extends in the circumferential direction around the axis AX. The second end 302, i.e., the wall 31*wb*, is the other end of the waveguide path 20*w*. A plurality of beams 202*b* and the plurality of gaps 20*g* (i.e., a plurality of slots 302*s*) are disposed near the wall 31*wb* or along the wall 31*wb*. The plurality of beams 202*b* and the plurality of slots 302*s* are arranged alternately along the circumferential direction. The plurality of slots 302*s* extend long in the circumferential direction and are electromagnetically coupled to the emitter 16. The plurality of slots 302*s* are spaced apart from each other and arranged in the circumferential direction around the axis AX. The plurality of slots 302*s* may be arranged at equal intervals.

The connector 40 is connected to the resonator 20C so as to introduce the electromagnetic waves into the resonator 20C from an uppermost layer (i.e., the upper portion 20*a*) of a plurality of layers 320 (described later) of the waveguide path 20*w*. An inner conductor of the connector 40 is connected to a conductor plate 31*p* (described later) that defines the uppermost layer from below, and an outer conductor of the connector 40 is connected to a conductor plate 31*p* (upper wall 31*u*) that defines the uppermost layer from above.

In one embodiment, the waveguide path 20*w* has a folded structure including a plurality of folded portions, just like the waveguide paths of the resonators of the plasma processing apparatuses 1 and 1B. In one embodiment, the waveguide path 20*w* may be configured axially or rotationally symmetric with respect to the axis AX. Further, in one embodiment, just like the conductor portion of the resonator 20, the conductor portion 31 may include the inner portion 31*i* (or inner peripheral portion), an outer portion 310 (or outer peripheral portion), and a plurality of conductor plates 31*p*. The inner portion 31*i* and the outer portion 310 extend coaxially with respect to the axis AX. The plurality of conductor plates 31*p* extend in the radial direction with respect to the axis AX, and are arranged in parallel to each other along the vertical direction, which is the extension direction of the axis AX.

Just like the waveguide path 20*w* of the resonator 20, the waveguide path 20*w* of the resonator 20C may include the plurality of layers 320. The plurality of layers 320 extend in the radial direction with respect to the axis AX between the inner portion 31*i* and the outer portion 310, and are arranged alternately with the plurality of conductor plates 31*p*. Each of the plurality of layers 320 is connected to a layer arranged above it among the plurality of layers 320 at one of the plurality of folded portions arranged along the inner portion 31*i* or the outer portion 310.

In one embodiment, the first end 301 is provided above the wall 31*wb*, which is the second end 302. The first end 301 is provided by the outer portion 310. The first end 301 surrounds the uppermost layer of the plurality of layers 320 (i.e., the upper portion 20*a*). The second end 302 includes a wall 31*wb* surrounding a lowest layer of the plurality of layers 320 (lower portion 20*b*). The second end 302 extends in the circumferential direction around the axis AX above the emitter 16. Further, the plurality of slots 302*s* and the plurality of beams 202*b* are provided at a lowest conductor plate 31*b* that defines the lowest layer from below among the plurality of conductor plates 31*p*. The conductor plate 31*b* extends at above the upper electrode 14. In one embodiment, a distance in the radial direction between the axis AX and an outer edge of each of the plurality of slots 302*s* may be approximately equal to a radius of an inscribed circle of a polygon of the wall 31*wb*. In this resonator 20C, the electromagnetic waves are reflected from the wall 31*wb*, which is the second end 302, toward the first end 301. Further, a part of the electromagnetic waves propagating in the resonator 20C is coupled to the emitter 16 through the plurality of slots 302*s*.

In the plasma processing apparatus 1C, the inner portion 31*i* may have a substantially cylindrical shape whose central axis is the axis AX. The inner portion 31*i* may be formed by a tubular (e.g., cylindrical) conductor wall extending between adjacent conductor plates 31*p* in the vertical direction.

The outer portion 310 has a substantially cylindrical shape and has the axis AX as its central axis. The outer portion 310 may include a plurality of walls 31*w*. Each of the plurality of walls 31*w* extends between corresponding conductor plates 31*p* adjacent to each other in the vertical direction, and has a substantially cylindrical shape. At least the wall 31*wb* surrounding the lowest layer of the plurality of walls 31*w* (lower portion 20*b*) extends along sides of a polygon in a cross section perpendicular to the axis AX. Two or more of the plurality of walls 31*w* or all of the walls 31*w* may extend along the sides of the polygon in the cross section perpendicular to the axis AX. In one embodiment, the wall 31*wb* may have a polygonal tube shape. Further, two or more of the plurality of walls 31*w* or all of the walls 31*w* may have a polygonal tube shape. In the illustrated example, the polygon is a regular nonagon, but other polygons may also be used.

In one embodiment, the wall 31*wb* may be formed by a plurality of plate-like bodies 311. Further, each of two or more of the plurality of walls 31*w* or all the walls 31*w* may be formed by a plurality of plate-like bodies 311. Each of the plurality of plate-like bodies 311 is formed from the above-mentioned metal. Each of the plurality of plate-like bodies 311 may be a flat plate. Each of the plurality of plate-like bodies 311 extends along a corresponding side of the above-mentioned polygon in the cross section perpendicular to the axis AX.

In the resonator 20C, a magnitude of a current flowing through the conductor plate 31*b* in the radial direction with respect to the axis AX has a circumferential distribution in which the magnitude of the current is minimum in the direction from the axis AX toward corners of the polygon described above and is maximum at a center of each side of the above-mentioned polygon. Therefore, in each of the plurality of slots 302*s*, intensity distribution of an electric field is adjusted in the circumferential direction.

In one embodiment, the number of slots 302*s* may be equal to the number of corners of the polygon. Furthermore, a position of each of the plurality of corners of the polygon and a center position in the circumferential direction of a corresponding slot among the plurality of slots 302*s* may be aligned in the radial direction with respect to the axis AX. Normally, the magnitude of the current flowing through the conductor plate 31*b* in the radial direction toward a center of each slot 302*s* is maximum. On the other hand, in the resonator 20C, the magnitude of the current flowing through the conductor plate 31*b* in the radial direction has a circumferential distribution in which the magnitude of the current is weakened at the center of each of the plurality of slots 302*s* and strengthened between adjacent slots 302*s*. Therefore, in each of the plurality of slots 302*s*, uniformity of electric field strength distribution in the circumferential direction is improved.

The plurality of plate-like bodies 311 may be spaced apart from each other so as to provide gaps at the corners of the polygon described above. When the plurality of plate-like bodies 311 are spaced apart from each other so as to provide the gaps at the corners of the polygon, the magnitude of the current flowing in the radial direction toward the corners of the polygon is further reduced. In addition, a vertically extending edge of each of the plurality of plate-like bodies 311 may be connected to a vertically-extending edge of a corresponding other plate-like body among the plurality of plate-like bodies 311 at a corresponding corner of the above-mentioned polygon.

In the resonator 20C, the number of slots 302*s* may be nine. That is, the number of slots 302*s* is an odd number. When the number of slots 302*s* is an odd number, generation of an electric field intensity distribution (or plasma density distribution), which is two-fold rotationally symmetric around the axis AX, in the plasma generating space is suppressed as compared with a case where the number of slots 302*s* is an even number. The number of slots 302*s* may be an odd number other than nine as long as it is five or more. The number of slots 302*s* in the resonator 20C may be an even number.

In the plasma processing apparatus 1C, the number of slots 302*s* may be equal to the number of corners of the polygon. Therefore, in the plasma processing apparatus 1C, the number of corners of the above-mentioned polygon may be an odd number. In the illustrated example, the polygon is a regular nonagon as described above.

Further, the resonator 20C may provide a plurality of inlets 31*h* that connect the waveguide path 20*w* and an outside of the resonator 20C to each other on any walls 31*w* of the outer portion 310. The plurality of inlets 31*h* may be arranged along the circumferential direction. In one embodiment, the plurality of inlets 31*h* are provided in the wall 31*wb* to connect the lowest layer of the plurality of layers 320 (lower portion 20*b*) of the waveguide path 20*w* to the outside of the resonator 20C.

The excitation electrode 13 (for example, the upper electrode 14) may include a built-in heating mechanism 143. The heating mechanism 143 may be a heater, such as a resistive heating element. In this case, the heating mechanism 143 is connected to a heater power source. Power of the heater power source may be controlled by a controller according to a difference between a temperature value of the excitation electrode 13 measured by a temperature sensor and a target value.

In the plasma processing apparatus 1C, the upper electrode 14 provides a plurality of slots 14*s*. The plurality of slots 14*s* are provided directly below the plurality of slots 302*s*. The upper electrode 14 also provides a waveguide path 14*w* between each of the plurality of slots 302*s* and the emitter 16. The waveguide path 14*w* extends in the circumferential direction about the axis AX, and has an annular shape in a plan view. In the plasma processing apparatus 1C, the electromagnetic waves emitted from the plurality of slots 302*s* are supplied to the emitter 16 via the plurality of slots 14*s* and the waveguide path 14*w*.

Further, the upper electrode 14 provides a cavity 421 inside the waveguide path 14*w* and between the upper electrode 14 and the resonator 20C. The cavity 421 is connected to the waveguide path 14*w* via a plurality of communication holes 14*c*. The plurality of communication holes 14*c* are arranged along the circumferential direction. In the plasma processing apparatus 1C, the cavity 421 is connected to a space outside the resonator 20C via the inlets 31*h*, the waveguide path 20*w*, the plurality of slots 302*s*, the plurality of slots 14*s*, the waveguide path 14*w*, and the plurality of communication holes 14*c*.

The plasma processing apparatus 1C may further include a heat sink 71 and a fan 72. The heat sink 71 is disposed on a support body 70 above the resonator 20C. The fan 72 is supported by the support body 70 and connected to a flow path in the heat sink 71. Further, in the plasma processing apparatus 1C, a cavity 422 is provided between the inner portion 31*i* of the resonator 20C and the gas pipe 64. The cavity 422 is connected between the cavity 421 and the flow path of the heat sink 71. The cavity 422 and the heat sink 71 are covered by a cover 73.

In the plasma processing apparatus 1C, a gas (e.g., an ambient air) outside the resonator 20C is supplied to the cavity 421 through the inlets 31*h*, the waveguide path 20*w*, the plurality of slots 302*s*, the plurality of slots 14*s*, the waveguide path 14*w*, and the plurality of communication holes 14*c*. The gas supplied to the cavity 421 flows along an upper surface of the upper electrode 14 and exchanges heat with the upper electrode 14, i.e., the excitation electrode 13. Thereafter, the gas is supplied to the flow path in the heat sink 71 through the cavity 422, cooled in the heat sink 71, and discharged to an outside from the fan 72.

Figure 13:
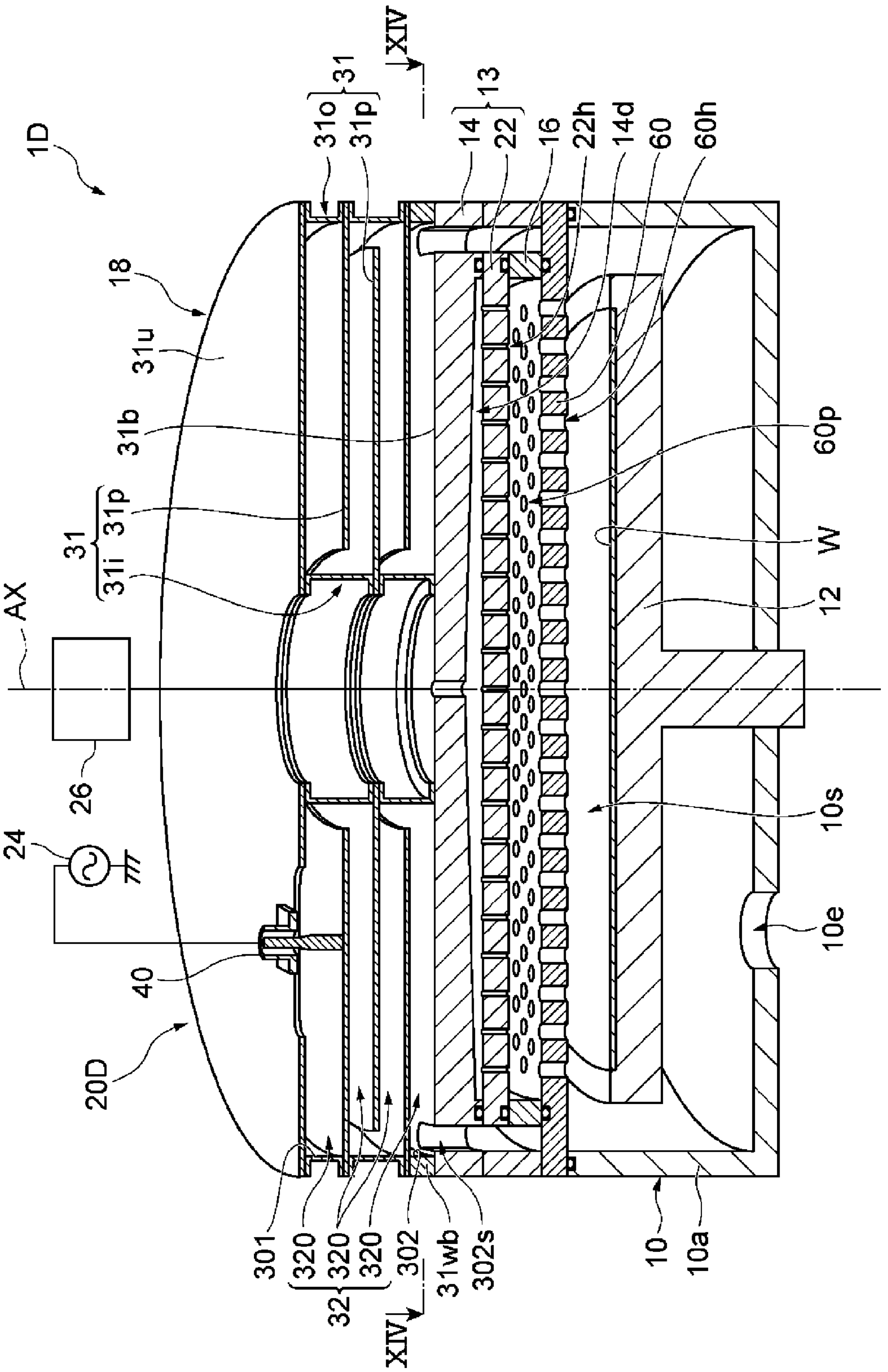
FIG. 13 is a diagram showing a plasma processing apparatus according to another exemplary embodiment.
Figure 14:
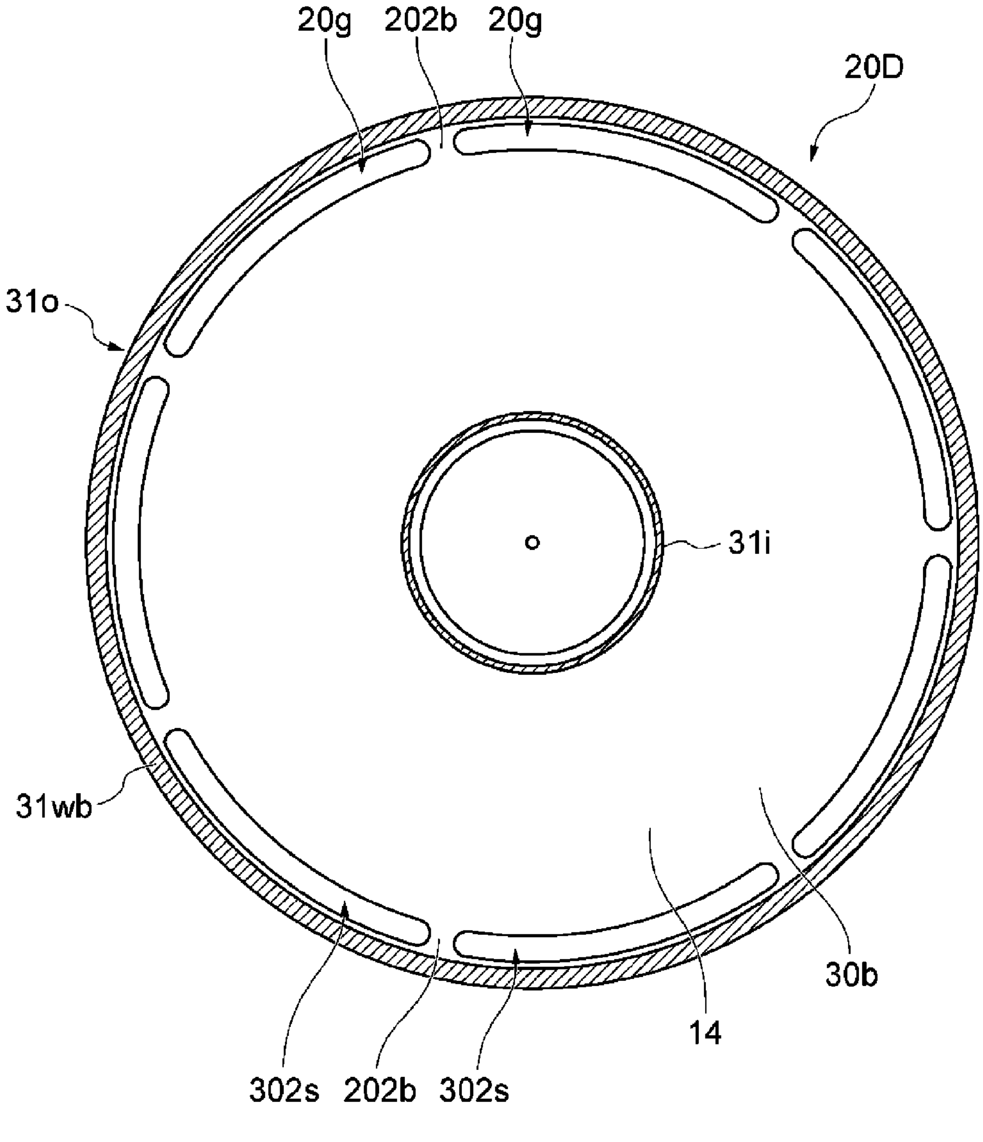
FIG. 14 is a cross-sectional view taken along line XIV-XIV in FIG. 13.

Hereinafter, a plasma processing apparatus according to another exemplary embodiment will be described with reference to FIGS. 13 and 14. FIG. 13 is a diagram showing a plasma processing apparatus according to another exemplary embodiment. FIG. 14 is a cross-sectional view taken along line XIV-XIV in FIG. 13. The plasma processing apparatus 1D shown in FIGS. 13 and 14 will be described below in terms of differences from the plasma processing apparatus 1C.

The plasma processing apparatus 1D further includes an electrode 60. The electrode 60 is another excitation electrode. The electrode 60 has a substantially disk-like shape and is disposed to close the opening at the upper end of the chamber 10. The electrode 60 provides a plurality of holes 60*h*. The plurality of holes 60*h* penetrate the electrode 60 in its thickness direction. The excitation electrode 13 is disposed above electrode 60. The excitation electrode 13 and the electrode 60 define a plasma generating space 60*p* between them. In the plasma processing apparatus 1D, the plasma generating space 60*p* is provided above the processing space 10*s* and is separated from the processing space 10*s*.

The emitter 16 surrounds the plasma generating space 60*p* and is sandwiched between the excitation electrode 13 and the electrode 60. In the plasma processing apparatus 1D, a gas supplied from the gas supply 26 is discharged from the plurality of gas holes 22*h* into the plasma generating space 60*p* via the gas diffusion space 14*d*. The gas in the plasma generating space 60*p* is excited by the electromagnetic waves emitted from the emitter 16 into the plasma generating space 60*p*. As a result, plasma is generated in the plasma generating space 60*p*. Active species among the plasma generated in the plasma generating space 60*p* are supplied to the processing space 10*s* through the plurality of holes 60*h*.

The plasma processing apparatus 1D includes a resonator 20D instead of the resonator 20C. In the resonator 20D, the outer portion 310 of the conductor portion 31 may have a substantially cylindrical shape centered on the axis AX. Further, in the resonator 20D, the conductor plate 31*b* of the conductor portion 31 may be the upper electrode 14. That is, in the resonator 20D, the plurality of slots 302*s* and the plurality of beams 202*b* may be formed at the upper electrode 14.

In the resonator 20D, the number of slots 302*s* may be seven. That is, in the resonator 20D, the number of slots 302*s* is an odd number. The number of slots 302*s* may be an odd number other than seven. The number of slots 302*s* in the resonator 20D may be an even number. Other configurations of the plasma processing apparatus 1D are the same as the corresponding configurations of the plasma processing apparatus 1C.

Although various exemplary embodiments have been described above, various additions, omissions, substitutions, and changes may be made without being limited to the exemplary embodiments described above. In addition, elements of different embodiments may be combined to form other embodiments.

Various exemplary embodiments included in the present disclosure are recited in [E1] to [E13] below.

[E1] A plasma processing apparatus, including:

a chamber configured to provide a processing space in the chamber;

a substrate support provided inside the processing space;

an upper electrode provided above the substrate support via the processing space;

an emitter provided to emit electromagnetic waves into a plasma generating space and extending in a circumferential direction around a central axis of the chamber and the processing space; and a waveguide configured to supply the electromagnetic waves to the emitter;

wherein the waveguide includes a resonator configured to provide a waveguide path, wherein the resonator includes a first short-circuit portion constituting one end of the waveguide path of the resonator and a plurality of second short-circuit portions constituting the other end of the waveguide path of the resonator or a plurality of beams provided along a third short-circuit portion constituted by a wall surface and constituting the other end of the waveguide path, wherein the plurality of second short-circuit portions or the plurality of beams are arranged axisymmetric around the central axis along the circumferential direction, and wherein the plurality of second short-circuit portions or the plurality of beams and a plurality of gaps electromagnetically coupled to the emitter are arranged alternately along the circumferential direction around the central axis.

[E2] The plasma processing apparatus of E1, wherein a distance d in the circumferential direction between two arbitrary second short-circuit portions adjacent in the circumferential direction among the plurality of second short-circuit portions or between two arbitrary beams adjacent in the circumferential direction among the plurality of beams satisfies a following formula (1):

$$0.05\lambda g < d < 0.3\lambda g, \quad (1)$$

where λg is a wavelength of the electromagnetic waves in the waveguide path of the resonator.

[E3] The plasma processing apparatus of E1 or E2, wherein the resonator length L of the resonator between the first short-circuit portion and the plurality of second short-circuit portions or between the first short-circuit portion and the third short-circuit portion satisfies a following formula (2):

$$(n-0.2)\lambda g/2 < L < n\lambda g/2, \quad (2)$$

where λg is a wavelength of the electromagnetic waves in the waveguide paths of the resonator, and n is an integer.

[E4] The plasma processing apparatus of any one of E1 to E3, wherein the waveguide path of the resonator includes a lower portion extending in a radial direction with respect to the central axis toward the plurality of second short-circuit portions or the plurality of beams around the central axis.

[E5] The plasma processing apparatus of E4, wherein the first short-circuit portion extends along the circumferential direction around the central axis, wherein the waveguide path of the resonator includes an upper portion extending from the first short-circuit portion in an opposite direction to the radial direction above the lower portion and around the central axis, and wherein the waveguide path of the resonator extends alternately in the radial direction and the opposite direction in a meandering manner from the first short-circuit portion to the plurality of second short-circuit portions or the third short-circuit portion, around the central axis.

[E6] The plasma processing apparatus of E5, further including:

a connector configured to introduce the electromagnetic waves into the waveguide path of the resonator, wherein the connector is coupled to the upper portion.

[E7] The plasma processing apparatus of E6, wherein a length of the upper portion in a vertical direction in which the central axis extends is longer than a length of other portions of the waveguide path of the resonator in the vertical direction.

[E8] The plasma processing apparatus of E6 or E7, wherein the connector is coupled to the upper portion at a position distanced apart from the central axis in the radial direction.

[E9] The plasma processing apparatus of any one of E4 to E8, wherein each of the plurality of second short-circuit portions is a columnar member made of metal and extending between a pair of conductor walls constituting the lower portion.

[E10] The plasma processing apparatus of any one of E4 to E8, wherein the upper electrode provides a plurality of slots provided as the plurality of gaps above the emitter and arranged along the circumferential direction around the central axis, and the plurality of beams are arranged alternately with the plurality of slots along the circumferential direction.

[E11] The plasma processing apparatus of any one of E1 to E10, further including:

a shower plate disposed below the upper electrode, wherein the emitter extends to surround the shower plate.

[E12] The plasma processing apparatus of any one of E1 to E11, further including:

a radio frequency power source electrically coupled to the waveguide path of the resonator and configured to generate a radio frequency power having a variable frequency and supply the electromagnetic waves into the waveguide path.

[E13] The plasma processing apparatus of any one of E1 to E12, wherein the number of the plurality of gaps is an odd number.

From the foregoing description, it will be understood that various embodiments of the present disclosure are described herein for purposes of illustration and that various changes may be made without departing from the scope and spirit of the present disclosure. Therefore, the various embodiments disclosed herein are not intended to be limitative, and the true scope and spirit are defined by the appended claims.

According to the present disclosure in some embodiments, it is possible to promote resonance of electromagnetic waves in a resonator of a plasma processing apparatus.

While certain embodiments have been described, these embodiments have been presented by way of example only, and are not intended to limit the scope of the disclosures. Indeed, the embodiments described herein may be embodied in a variety of other forms. Furthermore, various omissions, substitution, and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A plasma processing apparatus, comprising:

a chamber configured to provide a processing space in the chamber;

a substrate support provided inside the processing space;

an upper electrode provided above the substrate support via the processing space;

an emitter provided to emit electromagnetic waves into a plasma generating space and extending in a circumferential direction around a central axis of the chamber and the processing space; and a waveguide configured to supply the electromagnetic waves to the emitter, wherein the waveguide includes a resonator configured to provide a waveguide path, wherein the resonator includes a first short-circuit portion constituting one end of the waveguide path of the resonator and a plurality of second short-circuit portions constituting the other end of the waveguide path of the resonator or a plurality of beams provided along a third short-circuit portion constituted by a wall surface and constituting the other end of the waveguide path, wherein the plurality of second short-circuit portions or the plurality of beams are arranged axisymmetric around the central axis along the circumferential direction, wherein the plurality of second short-circuit portions or the plurality of beams and a plurality of gaps electromagnetically coupled to the emitter are arranged alternately along the circumferential direction around the central axis, and wherein a distance d in the circumferential direction between two arbitrary second short-circuit portions adjacent in the circumferential direction among the plurality of second short-circuit portions or between two arbitrary beams adjacent in the circumferential direction among the plurality of beams satisfies a following formula (1);

$$0.05\lambda g < d < 0.3\lambda g, \quad (1)$$

where λg is a wavelength of the electromagnetic waves in the waveguide path of the resonator.

2. The plasma processing apparatus of claim 1, wherein a resonator length L of the resonator between the first short-circuit portion and the plurality of second short-circuit portions or between the first short-circuit portion and the third short-circuit portion satisfies a following formula (2):

$$(n-0.2)\lambda g/2 < L < n\lambda g/2, \quad (2)$$

where λg is a wavelength of the electromagnetic waves in the waveguide path of the resonator, and n is an integer.

3. The plasma processing apparatus of claim 2, wherein the waveguide path of the resonator includes a lower portion extending in a radial direction with respect to the central axis toward the plurality of second short-circuit portions or the plurality of beams around the central axis.

4. The plasma processing apparatus of claim 3, wherein the first short-circuit portion extends along the circumferential direction around the central axis, wherein the waveguide path of the resonator includes an upper portion extending from the first short-circuit portion in an opposite direction to the radial direction above the lower portion and around the central axis, and wherein the waveguide path of the resonator extends alternately in the radial direction and the opposite direction in a meandering manner from the first short-circuit portion to the plurality of second short-circuit portions or the third short-circuit portion, around the central axis.

5. The plasma processing apparatus of claim 4, further comprising:

a connector configured to introduce the electromagnetic waves into the waveguide path of the resonator, wherein the connector is coupled to the upper portion.

6. The plasma processing apparatus of claim 5, wherein a length of the upper portion in a vertical direction in which the central axis extends is longer than a length of other portions of the waveguide path of the resonator in the vertical direction.

7. The plasma processing apparatus of claim 5, wherein the connector is coupled to the upper portion at a position distanced apart from the central axis in the radial direction.

8. The plasma processing apparatus of claim 3, wherein each of the plurality of second short-circuit portions is a columnar member made of metal and extending between a pair of conductor walls constituting the lower portion.

9. The plasma processing apparatus of claim 1, wherein the waveguide path of the resonator includes a lower portion extending in a radial direction with respect to the central axis toward the plurality of second short-circuit portions or the plurality of beams around the central axis.

10. The plasma processing apparatus of claim 1, wherein a resonator length L of the resonator between the first short-circuit portion and the plurality of second short-circuit portions or between the first short-circuit portion and the third short-circuit portion satisfies a following formula (2):

$$(n-0.2)\lambda g/2 < L < n\lambda g/2, \quad (2)$$

where λg is the wavelength of the electromagnetic waves in the waveguide path of the resonator, and n is an integer.

11. The plasma processing apparatus of claim 1, further comprising:

a radio frequency power source electrically coupled to the waveguide path of the resonator and configured to generate a radio frequency power having a variable frequency and supply the electromagnetic waves into the waveguide path.

12. The plasma processing apparatus of claim 1, wherein a number of the plurality of gaps is an odd number.

13. A plasma processing apparatus, comprising:

a chamber configured to provide a processing space in the chamber;

a substrate support provided inside the processing space;

an upper electrode provided above the substrate support via the processing space;

an emitter provided to emit electromagnetic waves into a plasma generating space and extending in a circumferential direction around a central axis of the chamber and the processing space; and a waveguide configured to supply the electromagnetic waves to the emitter, wherein the waveguide includes a resonator configured to provide a waveguide path, wherein the resonator includes a first short-circuit portion constituting one end of the waveguide path of the resonator and a plurality of second short-circuit portions constituting the other end of the waveguide path of the resonator or a plurality of beams provided along a third short-circuit portion constituted by a wall surface and constituting the other end of the waveguide path, wherein the plurality of second short-circuit portions or the plurality of beams are arranged axisymmetric around the central axis along the circumferential direction, wherein the plurality of second short-circuit portions or the plurality of beams and a plurality of gaps electromagnetically coupled to the emitter are arranged alternately along the circumferential direction around the central axis, and wherein the waveguide path of the resonator includes a lower portion extending in a radial direction with respect to the central axis toward the plurality of second short-circuit portions or the plurality of beams around the central axis.

14. The plasma processing apparatus of claim 13, wherein the first short-circuit portion extends along the circumferential direction around the central axis, wherein the waveguide path of the resonator includes an upper portion extending from the first short-circuit portion in an opposite direction to the radial direction above the lower portion and around the central axis, and wherein the waveguide path of the resonator extends alternately in the radial direction and the opposite direction in a meandering manner from the first short-circuit portion to the plurality of second short-circuit portions or the third short-circuit portion, around the central axis.

15. The plasma processing apparatus of claim 14, further comprising:

a connector configured to introduce the electromagnetic waves into the waveguide path of the resonator, wherein the connector is coupled to the upper portion.

16. The plasma processing apparatus of claim 15, wherein a length of the upper portion in a vertical direction in which the central axis extends is longer than a length of other portions of the waveguide path of the resonator in the vertical direction.

17. The plasma processing apparatus of claim 15, wherein the connector is coupled to the upper portion at a position distanced apart from the central axis in the radial direction.

18. The plasma processing apparatus of claim 13, wherein each of the plurality of second short-circuit portions is a columnar member made of metal and extending between a pair of conductor walls constituting the lower portion.

19. The plasma processing apparatus of claim 13, wherein the upper electrode provides a plurality of slots provided as the plurality of gaps above the emitter and arranged along the circumferential direction around the central axis, and the plurality of beams are arranged alternately with the plurality of slots along the circumferential direction.

* * * * *